(12) United States Patent
Yanagi et al.

(10) Patent No.: US 12,125,906 B2
(45) Date of Patent: Oct. 22, 2024

(54) SEMICONDUCTOR DEVICE WITH LATERAL TRANSISTOR

(71) Applicant: DENSO CORPORATION, Kariya (JP)

(72) Inventors: Shinichiro Yanagi, Kariya (JP); Yusuke Nonaka, Kariya (JP); Syogo Ikeura, Kariya (JP)

(73) Assignee: DENSO CORPORATION, Kariya (JP)

( * ) Notice: Subject to any disclaimer, the term of this patent is extended or adjusted under 35 U.S.C. 154(b) by 358 days.

(21) Appl. No.: 17/563,141

(22) Filed: Dec. 28, 2021

(65) Prior Publication Data

US 2022/0123142 A1   Apr. 21, 2022

Related U.S. Application Data

(63) Continuation of application No. PCT/JP2020/027071, filed on Jul. 10, 2020.

(30) Foreign Application Priority Data

Jul. 16, 2019   (JP) .................................. 2019-131334

(51) Int. Cl.
*H01L 29/78*   (2006.01)
*H01L 29/06*   (2006.01)
(Continued)

(52) U.S. Cl.
CPC ...... *H01L 29/7824* (2013.01); *H01L 29/0653* (2013.01); *H01L 29/0869* (2013.01);
(Continued)

(58) Field of Classification Search
CPC ............. H01L 29/7824; H01L 29/0653; H01L 29/0869; H01L 29/0886; H01L 29/1095; H01L 29/404; H01L 29/0696; H01L 29/0692; H01L 29/0878; H01L 29/786; H01L 29/40; H01L 29/402; H01L 29/405; H01L 29/45; H01L 29/665; H01L 29/66704; H01L 29/7825; H01L 29/4236; H01L 29/66659; H01L 29/66613–66628; H01L 29/66681–66704; H01L 29/7816–7826; H01L 29/7835; H01L 29/808; H01L 29/0634; H01L 29/66901; H01L 29/1066; H01L 29/78; H01L 29/0615; H01L 29/0661; H01L 29/0623; H01L 29/0865; H01L 29/41725; H01L 29/4238; H01L 29/0834; H01L 29/73; H01L 29/8086; H01L 29/7811;
(Continued)

(56) References Cited

U.S. PATENT DOCUMENTS

2007/0200195 A1   8/2007   Tanaka et al.
2011/0133269 A1   6/2011   Yamaji
(Continued)

FOREIGN PATENT DOCUMENTS

JP   2012-256633 A   12/2012
JP   2017-073567 A   4/2017

*Primary Examiner* — Natalia A Gondarenko
(74) *Attorney, Agent, or Firm* — Posz Law Group, PLC

(57) ABSTRACT

In a semiconductor device having a lateral transistor, a source wiring layer is disposed above at least a part of an interlayer insulating film. The interlayer insulating film is electrically connected to a source electrode and is extended toward a drain region to form a source field plate.

15 Claims, 8 Drawing Sheets

(51) Int. Cl.
  *H01L 29/08* (2006.01)
  *H01L 29/10* (2006.01)
  *H01L 29/40* (2006.01)

(52) U.S. Cl.
  CPC ...... *H01L 29/0886* (2013.01); *H01L 29/1095* (2013.01); *H01L 29/404* (2013.01)

(58) Field of Classification Search
  CPC ............. H01L 29/0619; H01L 29/0649; H01L 29/7832; H01L 29/0847; H01L 29/7838; H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 29/7801; H01L 29/7809; H01L 29/80
  USPC ....... 257/339, 335, 336, 343, 369, 408, 409, 257/481, 104, 493, 548
  See application file for complete search history.

(56) References Cited

U.S. PATENT DOCUMENTS

| | | | |
|---|---|---|---|
| 2013/0207179 A1* | 8/2013 | Lai | H01L 29/0847 257/328 |
| 2015/0069508 A1* | 3/2015 | Ko | H01L 29/0615 257/343 |
| 2015/0295081 A1 | 10/2015 | Matsuda | |
| 2015/0325693 A1 | 11/2015 | Mori | |
| 2016/0087074 A1* | 3/2016 | Prechtl | H01L 23/53238 438/652 |
| 2017/0330968 A1 | 11/2017 | Mori | |
| 2019/0363185 A1* | 11/2019 | You | H01L 29/404 |

\* cited by examiner

SEMICONDUCTOR DEVICE WITH LATERAL TRANSISTOR

CROSS REFERENCE TO RELATED APPLICATIONS

The present application is a continuation application of International Patent Application No. PCT/JP2020/027071 filed on Jul. 10, 2020, which designated the U.S. and claims the benefit of priority from Japanese Patent Application No. 2019-131334 filed on Jul. 16, 2019. The entire disclosures of all of the above applications are incorporated herein by reference.

TECHNICAL FIELD

The present disclosure relates to a semiconductor device having a lateral transistor, such as a lateral diffusion MOS-FET (hereinafter referred to as LDMOS).

BACKGROUND

A semiconductor device having a structure capable of reducing the resistance of a low breakdown voltage LDMOS has been proposed. In such a semiconductor device, a gate electrode is extended over a field oxide film to form a gate field plate (hereinafter referred to as GFP) so that a desired breakdown voltage can be obtained. Further, a drain drift layer is provided between a drain buffer layer made of an n type well region surrounding an $n^+$ type drain region and a p type body region surrounding an $n^+$ type source region. The drain drift layer is an n type region having a higher concentration than the $n^-$ type drift layer and reduces the resistance between the drain buffer layer and the p type body region. Such a semiconductor device has a structure applicable to, for example, a low breakdown voltage LDMOS of about 100 V.

On the other hand, in a high breakdown voltage LDMOS of 300 V or more, it is difficult to achieve an effect of sufficiently improving the breakdown voltage by the GFP. Therefore, it is generally known to provide a source field plate (hereinafter referred to as SFP) or a drain field plate (hereinafter referred to as DFP). The SFP is configured by extending a source electrode located in a layer above a gate electrode toward the drain. The DFP is configured by extending the drain electrode toward the source. In such a case, if the semiconductor device has the drain drift layer, it is difficult to secure the breakdown voltage. Therefore, the drain drift layer is not provided.

SUMMARY

The present disclosure describes a semiconductor device with a lateral transistor, which is capable of achieving a high breakdown voltage and a low resistance. A source wiring layer is disposed above at least a part of an interlayer insulating film. The interlayer insulating film is electrically connected to a source electrode and is extended toward a drain region to form a source field plate.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
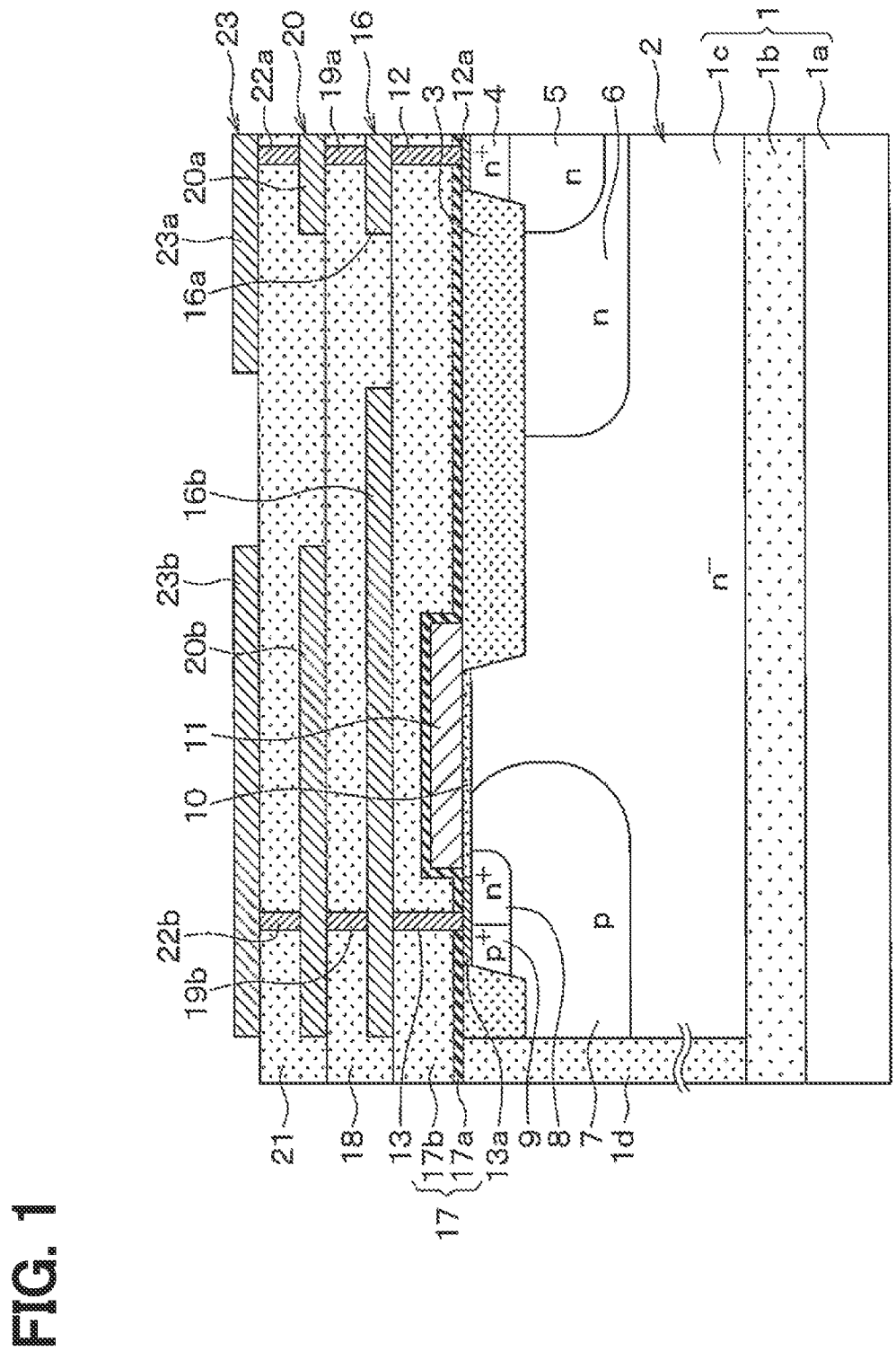
FIG. 1 is a diagram illustrating a cross-sectional view of a semiconductor device having a LDMOS according to a first embodiment of the present disclosure.

In a semiconductor device provided with a GFP, only a low breakdown voltage may be achieved. In a semiconductor device provided with a SFP or DFP, a drain drift layer may not be provided, so that the resistance may not be reduced. For these reasons, it has been difficult to achieve a high breakdown voltage as well as a low resistance in a region of, for example, about 100 V to 300 V.

The present disclosure provides a semiconductor device having a LDMOS capable of achieving a high breakdown voltage and a low resistance.

According to an aspect of the present disclosure, a semiconductor device with a lateral transistor includes a semiconductor substrate having a first conductivity type drift layer; a first conductivity type drain region disposed at a surface layer portion of the drift layer within the drift layer; a first conductivity type drain-drift layer disposed at the surface layer portion of the drift layer within the drift layer to surround the drain region, the drain-drift layer having an impurity concentration higher than that of the drift layer and lower than that of the drain region; a second conductivity type body layer disposed at the surface layer portion of the drift layer within the drift layer and at a position separate from the drain-drift layer, the body layer being configured to form a channel region; a first conductivity type source region disposed at a surface layer portion of the body layer within the body layer and terminated at a position inside from an end portion of the body layer; a separation insulating film disposed above the drain-drift layer and a part of the drift layer located between the body layer and the drain-drift layer; a gate insulating film disposed on a surface of the channel region of the body layer and connected to the separation insulating film, the channel region being provided in a part of the body layer between the source region and the drift layer; a gate electrode disposed on a surface of the gate insulating film and extending from a position above the gate insulating film to a position above the separation insulating film; an interlayer insulating film disposed above the gate electrode and the separation insulating film, and a drain electrode electrically connected to the drain region; a source electrode electrically connected to the source region and the body layer; and a source wiring layer disposed above at least a part of the interlayer insulating film and electrically connected to the source electrode, the source wiring layer extending toward the drain region to provide a source field plate.

In such a configuration, the source wiring layer is extended toward the drain side to form an SFP, and the drain drift layer is provided. Therefore, it is possible to achieve a high breakdown voltage as well as a low resistance, that is a low on-resistance.

Embodiments of the present disclosure will be hereinafter described with reference to the drawings. In the embodiments described hereinafter, the same or equivalent parts will be designated with the same reference numerals.

First Embodiment

A semiconductor device provided with a LDMOS according to a first embodiment of the present disclosure will be described with reference to FIGS. 1 and 2.

In the present embodiment, a SOI (silicon on insulator) substrate 1 is used as a semiconductor substrate to form the LDMOS. The SOI substrate 1 has a support substrate 1$a$ made of p type silicon or the like, a buried oxide (BOX) film 1$b$ as a buried insulating film, and an active layer 1$c$ made of n type silicon. The active layer 1$c$ is disposed on the support substrate 1$a$ via the buried oxide film 1$b$.

Figure 2:
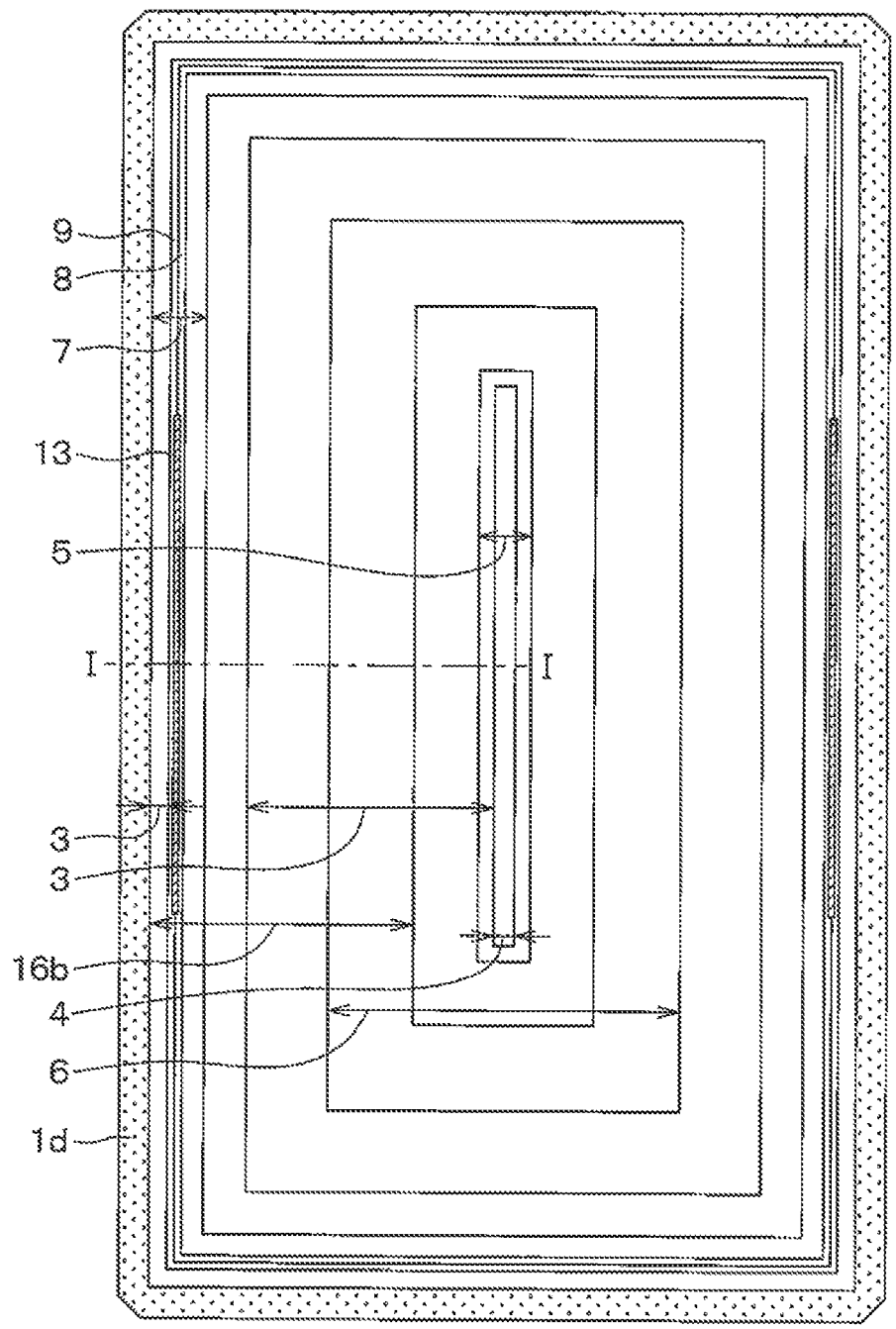
FIG. 2 is a diagram illustrating a top layout view of the LDMOS shown in FIG. 1.

Note that FIG. 2 shows one cell of the LDMOS, and FIG. 1 shows a cross-section taken along a line I-I in FIG. 2. As shown in FIGS. 1 and 2, the LDMOS of each cell is separated as an element by a trench separation structure 1$d$. The trench separation structure 1$d$ is provided by embedding the inside of a trench at a depth penetrating the active layer 1$c$ with an insulating film. Multiple cells of the LDMOS are arranged in the SOI substrate 1. Further, other elements such as CMOS are formed at different places in the SOI substrate 1 as needed. In this way, the semiconductor device is configured.

Of the SOI substrate 1, the active layer 1$c$ functions as an n$^-$ type drift layer 2. Respective parts constituting the LDMOS are formed in surface layer portion of the n$^-$ type drift layer 2. The n$^-$ type drift layer 2 has, for example, an n type impurity concentration of $1.0\times10^{15}$ to $4.0\times10^{15}$ cm$^{-3}$ and a thickness of 4 to 6 μm.

A shallow trench isolation (STI) film 3 as an insulating film for separation is formed on the surface of the n$^-$ type drift layer 2. The STI film 3 separates the respective parts constituting the LDMOS. The STI film 3 is formed by embedding an insulating film such as an oxide film in a trench formed in the n$^-$ type drift layer 2 and flattening the surface of the insulating film. The STI film 3, for example, has a thickness of 0.3 to 0.4 μm. As an example, the insulating film for separation is the STI film 3. Alternatively, the insulating film for separation may be a LOCOS film or the like.

As shown in FIG. 2, an n$^+$ type drain region 4 having a rectangular top surface shape is formed in a part of the surface layer portion of the n$^-$ type drift layer 2 where the STI film 3 is not formed. The n$^+$ type drain region 4 has an impurity concentration higher than that of the n$^-$ type drift layer 2. The n$^+$ type drain region 4, for example, has an n type impurity concentration of $0.1\times10^{20}$ to $4.0\times10^{20}$ cm$^{-3}$, and has a thickness of 0.1 to 0.2 μm. The n$^+$ type drain region 4 is surrounded by an n type drain buffer layer 5 made of an n type well layer. The n type drain buffer layer 5 has an impurity concentration higher than that of the n$^-$ type drift layer 2 and lower than that of the n$^+$ type drain region 4. The n type drain buffer layer 5, for example, has an n type impurity concentration of $2.0\times10^{17}$ to $6.0\times10^{17}$ cm$^{-3}$, and a thickness of 0.5 to 0.8 μm.

Further, the n type drain buffer layer 5 is surrounded by the n type drain drift layer 6. The STI film 3 described above is formed on the n type drain drift layer 6 and the n$^-$ type drift layer 2. The n type drain drift layer 6 has an impurity concentration higher than that of the n$^-$ type drift layer 2 and lower than that of the n type drain buffer layer 5. The n type drain drift layer 6, for example, has an n type impurity concentration of $1.0\times10^{16}$ to $3.0\times10^{16}$ cm$^{-3}$, and a thickness of 1.0 to 1.4 μm.

Both the n type drain buffer layer 5 and the n type drain drift layer 6 are arranged concentrically around the n$^+$ type drain region 4 and each have a rectangular shape corresponding to the n$^+$ type drain region 4.

Further, a p type body layer 7, an n$^+$ type source region 8, and a p$^+$ type contact layer 9 are formed in a region of the surface layer portion of the n$^-$ type drift layer 2 where the STI film 3 is not formed. The p type body layer 7, the n$^+$ type source region 8, and the p$^+$ type contact layer 9 are formed centering on the n$^+$ type drain region 4.

The p type body layer 7 has a function of forming a channel region on the surface and a function of reducing the voltage drop caused by a Hall current flowing through the surface from the drain to the source. The p type body layer 7 forms a channel region as being inverted when a gate voltage is applied to the gate electrode 11 described later. The p type body layer 7 also serves to reduce the voltage drop caused by the Hall current flowing through the surface from the drain to the source. The p type body layer 7 restricts a parasitic npn transistor composed of the n$^+$ type source region 8, the p type body layer 7, and the n$^-$ type drift layer 2 from being operated, and can improve the turn-off time. As shown in FIG. 2, the p type body layer 7 is arranged so as to surround the periphery of the n$^+$ type drain region 4 entirely. The p type body layer 7 is arranged concentrically with the n$^+$ type drain region 4 as the center. For example, the p type body layer 7 has a p type impurity concentration of $0.1\times10^{18}$ to $2.0\times10^{18}$ cm$^{-3}$ and a thickness of 1.0 to 1.5 μm.

Further, the n$^+$ type source region 8 is arranged at a distance from the n$^+$ type drain region 4 in the surface layer portion of the p type body layer 7, and is formed so as to be terminated more to inside than the termination position of the p type body layer 7. For example, the n$^+$ type source region 8 has an n type impurity concentration of $0.1\times10^{20}$ to $4.0\times10^{20}$ cm$^{-3}$ and a thickness of 0.1 to 0.2 μm. As shown in FIG. 2, the n$^+$ type source region 8 is also arranged concentrically so as to surround the n$^+$ type drain region 4.

The p$^+$ type contact layer 9 is for fixing the p type body layer 7 to the source potential, and has an impurity concentration higher than that of the p type body layer 7. For example, the p$^+$ type contact layer 9 has a p type impurity concentration of $0.1\times10^{19}$ to $5.0\times10^{19}$ cm$^{-3}$ and a thickness of 0.1 to 0.2 μm. As shown in FIG. 2, the p$^+$ type contact layer 9 is also arranged so as to surround the periphery of the n$^+$ type drain region 4 entirely. The p$^+$ type contact layer 9 is arranged concentrically around the n$^+$ type drain region 4. In the case of the present embodiment, a metal silicide film 12$a$ is formed on the surface of the n$^+$ type drain region 4, and a metal silicide film 13$a$ is formed on the surface of the n$^+$ type source region 8 and the p$^+$ type contact layer 9. The metal silicide film 12$a$ provides an ohmic contact between the n$^+$ type drain region 4 and the drain electrode 12 described later. Also, the metal silicide film 13a provides an ohmic contact between the source electrode 13 described later and the n$^+$ type source region 8 and p$^+$ type contact layer 9.

On the surface of the p type body layer 7, a gate electrode 11 is arranged through a gate insulating film 10. The gate electrode 11 is made of a doped Poly-Si. By applying the gate voltage to the gate electrode 11, the channel region is formed in the surface portion of the p type body layer 7. More specifically, the gate insulating film 10 is formed on the channel region and is connected to the STI film 3. The gate electrode 11 is arranged so as to extend from a position above the gate insulating film 10 to a position above the STI film 3.

A drain electrode 12 is formed on the surface of the n$^+$ type drain region 4, and is electrically connected to the n$^+$ type drain region 4.

On the surfaces of the n$^+$ type source region 8 and the p$^+$ type contact layer 9, a source electrode 13 is formed to be electrically connected to the n$^+$ type source region 8 and the p$^+$ type contact layer 9. In the cross section shown in FIG. 1, the gate electrode 11 and the source electrode 13 are arranged on the left side of the drain electrode 12. Yet, as shown in FIG. 2, the gate electrode 11, the source electrode 13 and the like are formed so as to surround the drain electrode 12. Therefore, a cross-sectional structure that is line-symmetrical with the cross-sectional structure shown in FIG. 1 is also arranged on the right side of the drain electrode 12 centering on the drain electrode 12. In another cross section, the gate electrodes 11 and the source electrodes 13 arranged on both sides of the drain electrode 12 are connected.

Further, the gate electrode 11 extends not only on the gate insulating film 10 arranged on the p type body layer 7 and directly above the n$^-$ type drift layer 2, but also on the STI film 3. The portion of the gate electrode 11 extended on the STI film 3 also functions as the GFP. That is, when a high voltage is applied to the drain, a high electric field is applied between the source and the drain, and thus the equipotential lines in the n$^-$ type drift layer 2 extend in the thickness direction. The equipotential lines are inclined toward the drain side by the GFP having a low voltage about 0 V, so that the electric field is relaxed in the part where the high electric field is applied.

Further, a first interlayer insulating film 17 is formed on the gate electrode 11 and the STI film 3. The interlayer insulating film 17 may be a single-layer film. In the present embodiment, as an example, the interlayer insulating film 17 is made of a multi-layer film including a silicon nitride (SiN) film 17a and an insulating film 17b such as a tetra ethoxy silane (TEOS) film stacked on the silicon nitride film 17a.

Contact holes are formed in various places of the first interlayer insulating film 17. The drain electrode 12 is connected to the n$^+$ type drain region 4 through the contact hole. Also, the source electrode 13 is connected to the n$^+$ type source region 8 and the p$^+$ type contact layer 9 through the contact hole. Although not shown in FIG. 1, the gate electrode 11 is also connected to a gate wiring formed in another cross section through the contact hole.

On the surface of the first interlayer insulating film 17, a first Al layer 16, which is a first-layer metal wiring layer made of an aluminum material, is patterned to provide a drain wiring layer 16a and a source wiring layer 16b. The drain wiring layer 16a is connected to the drain electrode 12, and the source wiring layer 16b is connected to the source electrode 13. In the case of the present embodiment, the source wiring layer 16b is extended toward the drain side and is formed also above the STI film 3 to thereby form the SFP. The source wiring layer 16b is extended toward the drain side over the GFP. More specifically, the source wiring layer 16b and the n type drain drift layer 6 are arranged so as to overlap each other in the normal direction with respect to the surface of the active layer 1c.

Similar to the GFP, the SFP has a function of inclining the equipotential lines in the n$^-$ type drift layer 2 toward the drain side when a high voltage is applied to the drain, thereby to relax an electric field of the part where the high electric field is applied. The SFP has a voltage constant at the source potential, that is, 0 V, and does not have a voltage that changes when the LDMOS is driven like the gate voltage. Therefore, the SFP enables more stable electric field relaxation.

In the case of GFP, since the distance from the surface of the n$^-$ type drift layer 2 to which a high electric field is applied is defined only by the film thickness of the STI film 3 or the film thickness of the gate insulating film 10, a high electric field region where the high electric field is applied changes according to the length of the GFP. Specifically, if the length of GFP is reduced, the high electric field region is biased toward the source side, so that the breakdown voltage can only be obtained to a certain extent. On the other hand, if the length of GFP is increased than that, the high electric field region is dispersed, so that an electric field relaxation effect can be obtained to realize a high breakdown voltage. However, if the length of the GFP is increased too much, the high electric field region is biased directly below the tip position of the GFP. For this reason, the dispersion effect of the high electric field region is weakened, and the electric field relaxation effect cannot be obtained. As a result, the breakdown voltage is lowered. Therefore, in the case of the GFP, the limit of the extension length to be extended to the drain side is short. On the other hand, when the source wiring layer 16b made of the first Al layer 16 is provided as the SFP, the distance from the surface of the n$^-$ type drift layer 2 is defined by the film thickness of the first interlayer insulating film 17 in addition to the film thickness of the STI film 3 or the gate insulating film 10. Therefore, in the case of the SFP, the limit of the extension length to be extended to the drain side is greater than that of the GFP. Therefore, the SFP is extended to the drain side more than the GFP, so that the electric field relaxation effect of the SFP can be further obtained.

Further, a second interlayer insulating film 18 made of TEOS or the like is formed on the surface of the first interlayer insulating film 17 including the surface of the first Al layer 16. Contact holes are formed in various places also in the second interlayer insulating film 18, and a drain wiring plug 19a and a source wiring plug 19b are formed in the contact holes. A second Al layer 20, which is a second-layer metal wiring layer made of an aluminum material, is patterned on the surface of the second interlayer insulating film 18 so as to form a drain wiring layer 20a and a source wiring layer 20b. The drain wiring plug 19a is connected to the drain wiring layer 20a, and the source wiring plug 19b is connected to the source wiring layer 20b. Although the drain wiring plug 19a, the source wiring plug 19b, and the second Al layer 20 are described as separate configurations here, the drain wiring plug 19a and the source wiring plug 19b may be provided by the second Al layer 20.

Further, a third interlayer insulating film 21 made of TEOS or the like is formed on the surface of the second interlayer insulating film 18 including the surface of the second Al layer 20. Contact holes are formed in various places also in the third interlayer insulating film 21, and a drain wiring plug 22a and a source wiring plug 22b are formed in the contact holes. A third Al layer, which is a third-layer metal wiring layer, is patterned on the surface of the third interlayer insulating film 21, so as to form a drain wiring layer 23a and a source wiring layer 23b. The drain wiring plug 22a is connected to the drain wiring layer 23a, and the source wiring plug 22b is connected to the source wiring layer 23b.

The semiconductor device provided with the LDMOS according to the present embodiment is thus configured as described above. The LDMOS provided in the semiconductor device configured as described above operates when a predetermined gate voltage is applied to the gate electrode in a state where the drain electrode 12 is applied with a predetermined positive drain voltage and the source electrode 13 is kept at a source potential of 0 V. For example, when a gate voltage of 5 V is applied to the gate electrode 11, an inverted channel region is formed in the surface layer portion of the p type body layer 7 located below the gate electrode 11. Thus, an electrical conduction occurs between the source electrode 13 and the drain electrode 12 via the channel region. As a result, a MOSFET operation causing the electric current between the source and the drain is performed.

In the present embodiment, the LDMOS is provided with the SFP by extending the source wiring layer 16b toward the drain side, and the n type drain drift layer 6. Therefore, it is possible to reduce the resistance, that is, to reduce the on-resistance while achieving a high breakdown voltage.

That is, since the SFP that has the source potential is extended to the drain side, it is possible to lower the potential of the portion below the SFP, as compared with the case where the SFP is not formed. Therefore, when the drain is applied with a high voltage and a high electric field is caused between the source and the drain, the equipotential lines are further inclined toward the drain side. As such, the electric field is relaxed in the portion where the high electric field is applied. Further, in the case of the SFP, the distance from the surface of the n⁻ type drift layer 2 to the SFP is defined by the total film thickness of the STI film 3 and the first interlayer insulating film 17. Therefore, in the case of the SFP, the limit of the extension length toward the drain is long. Thus, the electric field relaxation effect by the SFP can be further obtained, and a higher breakdown voltage can be achieved.

Further, since the breakdown voltage can be increased by having the SFP, it is possible to have the n type drain drift layer 6. That is, even if the width to which a high electric field is applied, that is, the distance from the p type body layer 7 to the portion where the n type impurity concentration is relatively high is shortened by having the n type drain drift layer 6, the breakdown voltage can be ensured. Since the n type drain drift layer 6 can be provided in the LDMOS in this way, it is possible to achieve lower resistance than in the case where the n type drain drift layer 6 is not provided.

Further, the LDMOS is provided with the SFP as well as the GFP. Therefore, it is possible to improve the breakdown voltage by the SFP while improving the breakdown voltage by the GFP by making the potential lower at a position closer to the n⁻ type drift layer 2 by the GFP. As such, a semiconductor device having a higher breakdown voltage can be achieved.

Figure 3:
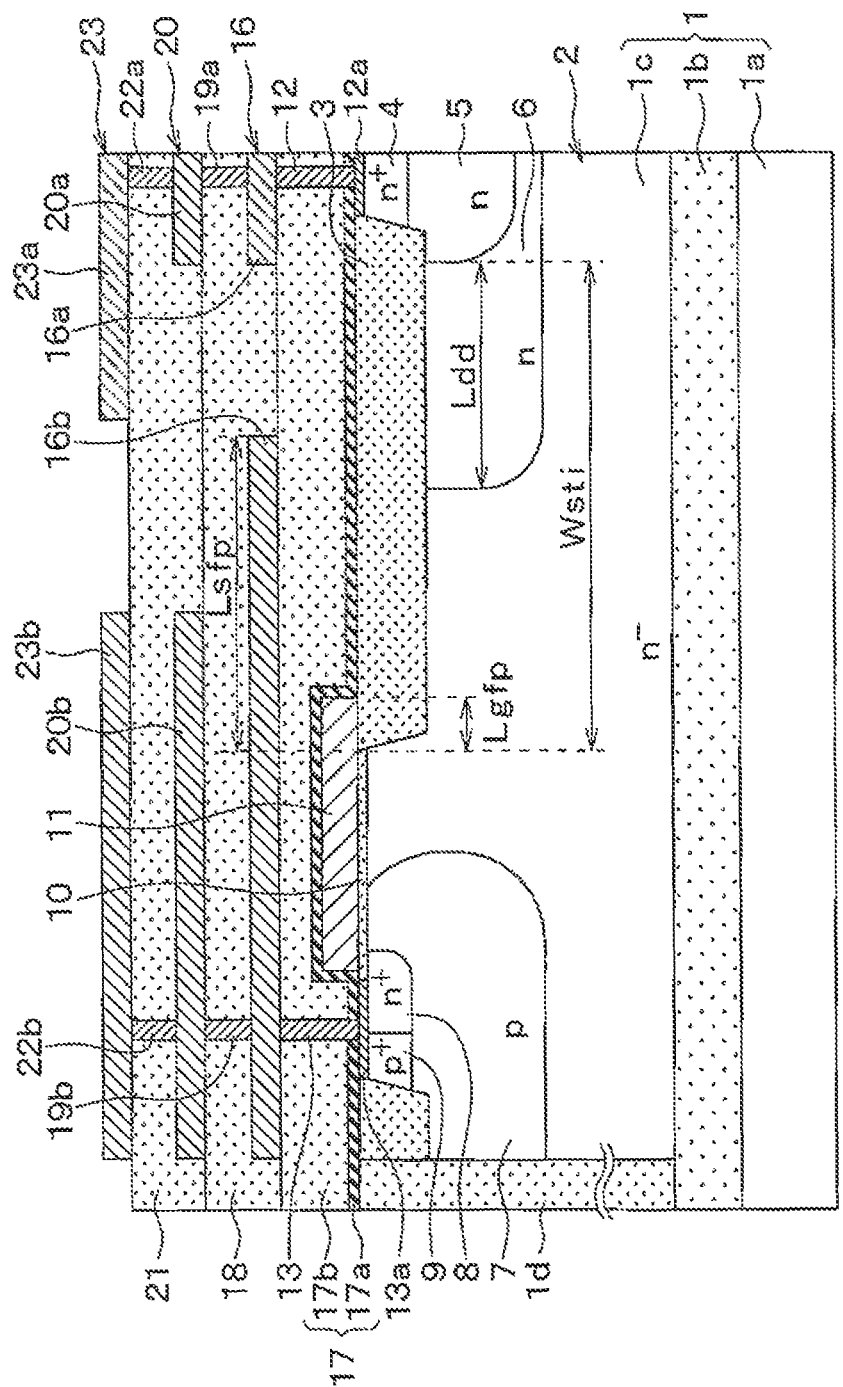
FIG. 3 is a diagram illustrating the cross-sectional view of the semiconductor device for explaining the dimension of each part of the LDMOS.

Further, in the structure provided with the n type drain drift layer 6 as well as the SFP, as shown in FIG. 3, it is preferable that a length Lsfp of the SFP, a length Ldd of the n type drain drift layer 6 and a width Wsti of the STI film 3 have a predetermined relationship. Specifically, it is preferable that the difference Ldd-Lsfp between the length Ldd and the length Lsfp is within the range of −10% to +20% of the width Wsti. The reason for this will be described with reference to the simulation results shown in FIGS. 4 and 5.

The length Lsfp, the length Ldd, and the width Wsti each correspond to the length of each part shown in the cross section of FIG. 1, that is, correspond to the dimension of each part on a connection line connecting the source and the drain at the shortest distance. The length Lsfp is a dimension of the SFP located on the STI film 3. On the same connection line, the dimension of the GFP located above the STI film 3 is defined as the length Lgfp. In this case, the length Lsfp is longer than the length Lgfp. The length Ldd is a dimension from the tip of the n type drain buffer layer 5 to the tip of the n type drain drift layer 6. The width Wsti is a dimension of the STI film 3 above the n⁻ type drift layer 2 and the n type drain drift layer 6. Hereinafter, the proportion of the difference Ldd-Lsfp with respect to the width Wsti is simply referred to as the proportion of the difference Ldd-Lsfp. Further, the proportion of the length Ldd with respect to the width Wsti is simply referred to as the proportion of the length Ldd.

Figure 4:
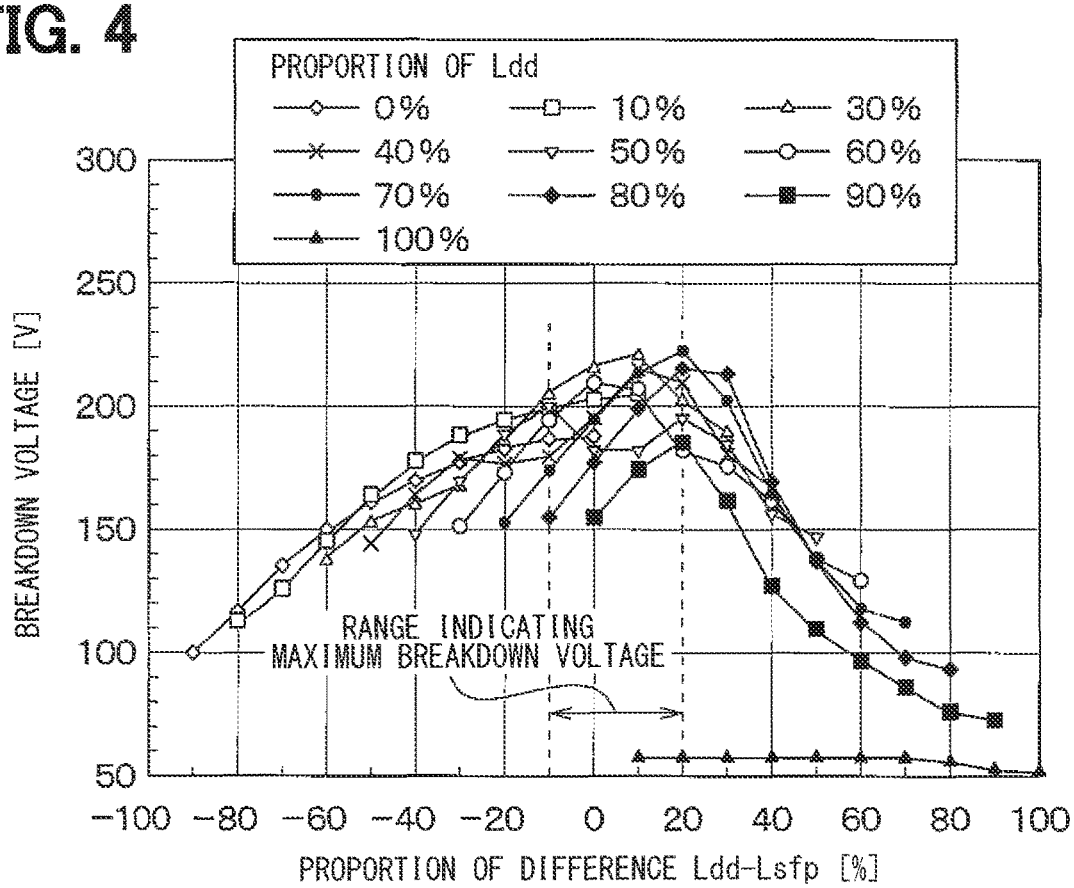
FIG. 4 is a diagram illustrating the measurement results of breakdown voltages when the proportion of the length Ldd is changed from 0% to 100% and the length Lsfp is also changed in the respective ratios.

As described above, in the structure provided with the SFP and the n type drain drift layer 6 as in the present embodiment, it is possible to realize the low resistance while obtaining the high breakdown voltage. However, there is a limit to the length of the SFP to be extended. Thus, in the structure provided with the n type drain drift layer 6, it is assumed that the limit of the extension length is shorter. Therefore, the present inventors diligently studied the relationship between the length Lsfp and the length Ldd and the breakdown voltage, and found that the breakdown voltage has a dependency on the difference Ldd-Lsfp. FIG. 4 shows the result. Specifically, in FIG. 4, a horizontal axis represents the difference Ldd-Lsfp and a vertical axis represents the breakdown voltage. The proportion of the length Ldd is changed from 0 to 100%, and the length Lsfp is changed in each case. The breakdown voltage is measured when the length Lsfp is changed in each case where the proportion of the length Ldd is changed.

Figure 5:
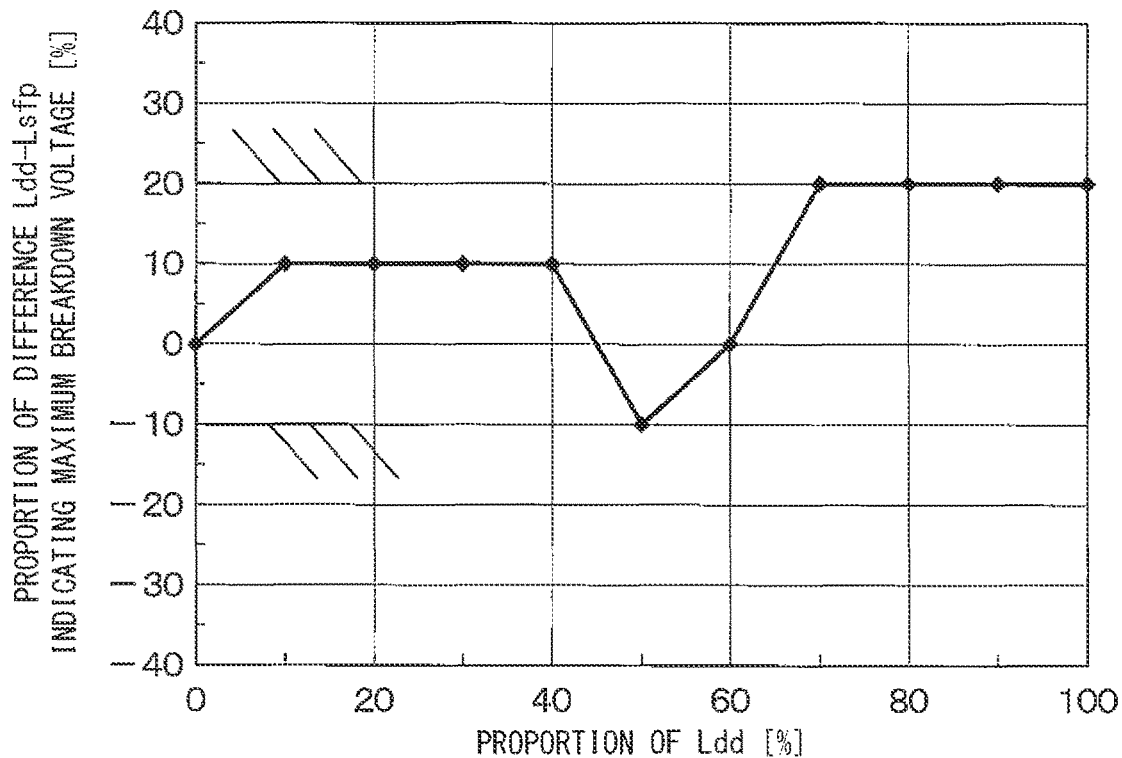
FIG. 5 is a diagram illustrating a relationship between the proportion of the Ldd and the proportion of the difference between Ldd and Lsfp in which the maximum breakdown voltage extracted in each Ldd ratio in FIG. 4 is potted.

As shown in FIG. 4, it can be seen that even if the length Ldd and the length Lsfp are variously changed, the range in which the breakdown voltage is at the maximum value is almost similar. FIG. 5 is a graph in which a horizontal axis represents the proportion of the Ldd length and a vertical axis represents the proportion of the difference Ldd-Lsfp. The proportion of the difference Ldd-Lsfp at which the breakdown voltage is the maximum value in FIG. 4 is extracted for each case and plotted in FIG. 5. As can be clear from FIG. 5, in any cases where the length Ldd is 0 to 100%, that is, regardless of the length Ldd, the breakdown voltage is the maximum value in the range where the proportion of the difference Ldd-Lsfp is −10% to +20%. From this, it can be said that, when the proportion of the difference Ldd-Lsfp is in the range of −10% to 20%, it is possible to achieve a higher breakdown voltage while achieving a lower resistance by having the n type drain drift layer 6.

Further, for the n type drain drift layer 6, it is more preferable that the proportion of the length Ldd is larger than 0% and equal to or less than 80%.

As described above, when the LDMOS is provided with the n type drain drift layer 6, the resistance can be reduced because the n type drain drift layer 6 has the n type impurity concentration higher than that of the n⁻ type drift layer 2. However, the end portion of the n type drain drift layer 6 becomes close to the PN junction between the p type body layer 7 and the n⁻ type drift layer 2. Therefore, a high electric field is caused between the n type drain drift layer 6 and the p type body layer 7. With this, the region where the high electric field is caused is reduced with the increase in the length Ldd of the n type drain drift layer 6. As such, there is a trade-off between the decrease in the resistance and the increase in the breakdown voltage.

Figure 6:
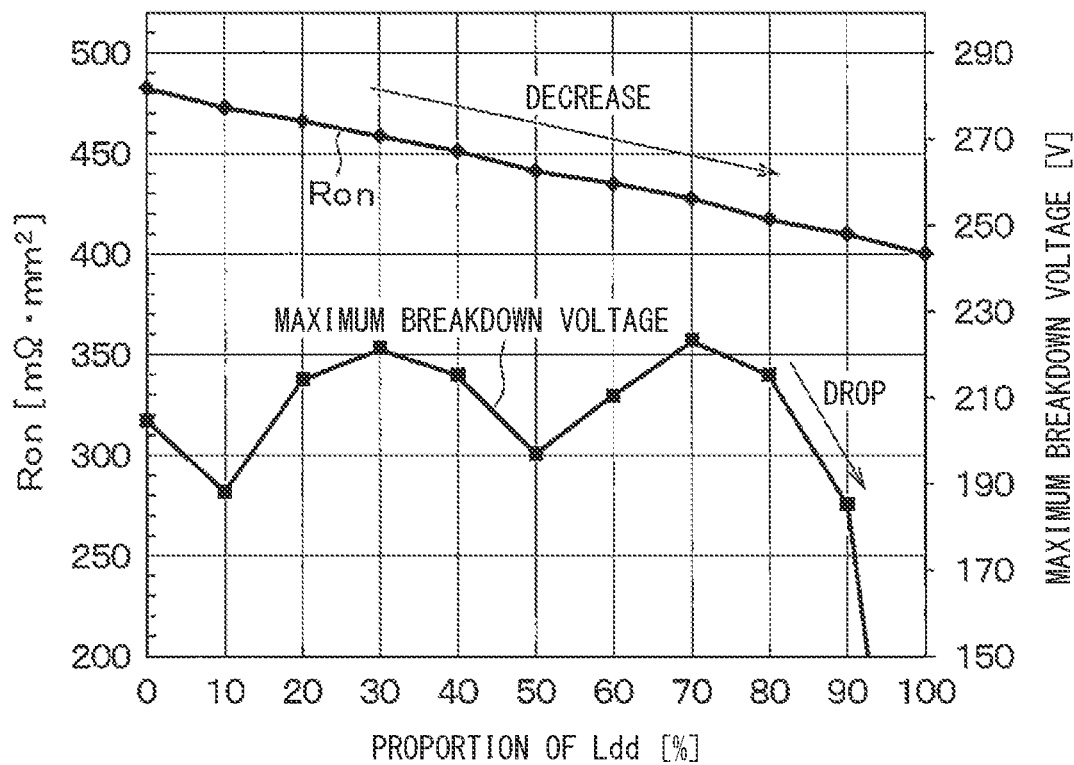
FIG. 6 is a diagram illustrating the measurement results of the on-resistance Ron and the breakdown voltage by changing the length Ldd.

FIG. 6 shows the results where the on-resistance Ron and the breakdown voltage are measured by changing the length Ldd. As shown in FIG. 6, the on-resistance Ron decreases as the proportion of the length Ldd increases. The breakdown voltage is secured in the range where the proportion of the length Ldd is 80% or less, but sharply drops when the proportion of the length Ldd exceeds 80%. The desired breakdown voltage can be obtained even if the proportion of the length Ldd exceeds 80%. However, in a manufacturing process of the semiconductor device, a manufacturing error will occur and also affect the length Ldd. As a result, the desired breakdown voltage may not be obtained. Therefore, it is preferable that the proportion of the length Ldd is 80% or less as a range in which the desired breakdown voltage can be obtained even taking in consideration of the manufacturing error.

It should be noted that the dimensions that keep the proportion of the length Ldd being 80% or less while keeping the proportion of the difference Ldd-Lsfp in the range of −10% to +20% may have various values. As an example, the width Wsti can be 10 µm, the length Lsfp can be 7.0 µm, and the length Ldd can be 6.5 µm. In this case, the proportion of the difference Ldd-Lsfp is −5%, and the proportion of the length Ldd is 65%, and thus both of which are within the desired ranges. It has been confirmed that a breakdown voltage of 200 V or higher can be achieved with such dimensions, and thus a high breakdown voltage can be obtained while achieving a low resistance.

Second Embodiment

The following describes a second embodiment of the present disclosure. The present embodiment is the same as the first embodiment except that the configuration of the SFP is modified from that of the first embodiment, and thus only portions different from the first embodiment will be described.

Figure 7:
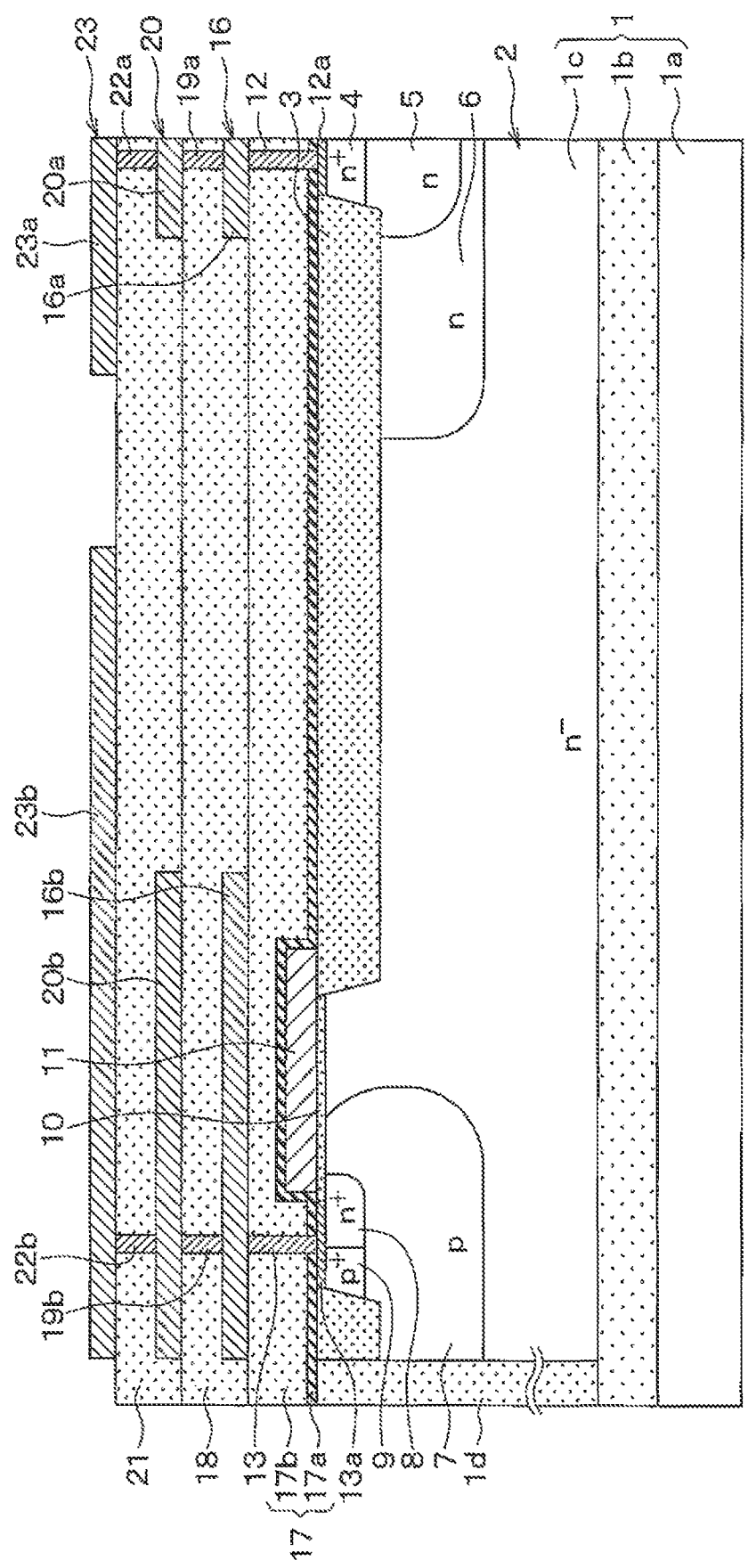
FIG. 7 is a diagram illustrating a cross-sectional view of a semiconductor device having a LDMOS according to a second embodiment of the present disclosure.

In the first embodiment, the SFP is configured by extending the source wiring layer 16b in the first layer toward the drain side. In the present embodiment, the SFP is configured by using a source wiring layer different from the source wiring layer 16b. Specifically, in the present embodiment, the SFP is configured by extending a third source wiring layer 23b toward the drain side, as shown in FIG. 7.

In a case where the semiconductor device has a multi-layer wiring structure, the SFP may be configured by using a source wiring layer of any of the multi-layer wirings. In a case where the source wiring layer on a lower layer of the multi-layer wirings is used rather than the source wiring layer on an upper layer, since the distance from the surface of the n⁻ type drift layer 2 is shorter, the equipotential lines can be more inclined toward the drain side. On the other hand, the film thickness existing between the source wiring layer and the surface of the n⁻ type drift layer 2 is reduced, and thus the breakdown voltage is likely to be lowered. Therefore, it is preferable to determine which source wiring layer in the multi-layer wirings is used to form the SFP depending on a required breakdown voltage.

If the SFP is configured by extending the third source wiring layer 23b to the drain side as in the present embodiment, the STI film 3, the first interlayer insulating film 17, the second interlayer insulating film 18 and the like can be interposed between the source wiring layer 23b on the third layer and the surface of the n⁻ type drift layer 2. Therefore, it is possible to provide the semiconductor device having a higher breakdown voltage.

Also in the configuration of the present embodiment, it is preferable that the proportion of the difference Ldd-Lsfp is in the range of −10% to +20% and the proportion of the length Ldd is 80% or less. As an example, the width Wsti can be 20 µm, the length Lsfp can be 10 µm, and the length Ldd can be 10 µm. In this case, the proportion of the difference Ldd-Lsfp is 0% and the proportion of the length Ldd is 50%, both of which are within the desired ranges. Further, it has been confirmed that the breakdown voltage of 300 V or more can be obtained with such dimensions, and thus the higher breakdown voltage can be obtained while achieving the lower resistance.

Other Embodiments

While the present disclosure has been described in accordance with the embodiments described above, the present disclosure is not limited to the embodiments and includes various modifications and equivalent modifications. In addition, various combinations and configurations, as well as other combinations and configurations that include only one element, more, or less, are within the scope and spirit of the present disclosure.

Figure 8:
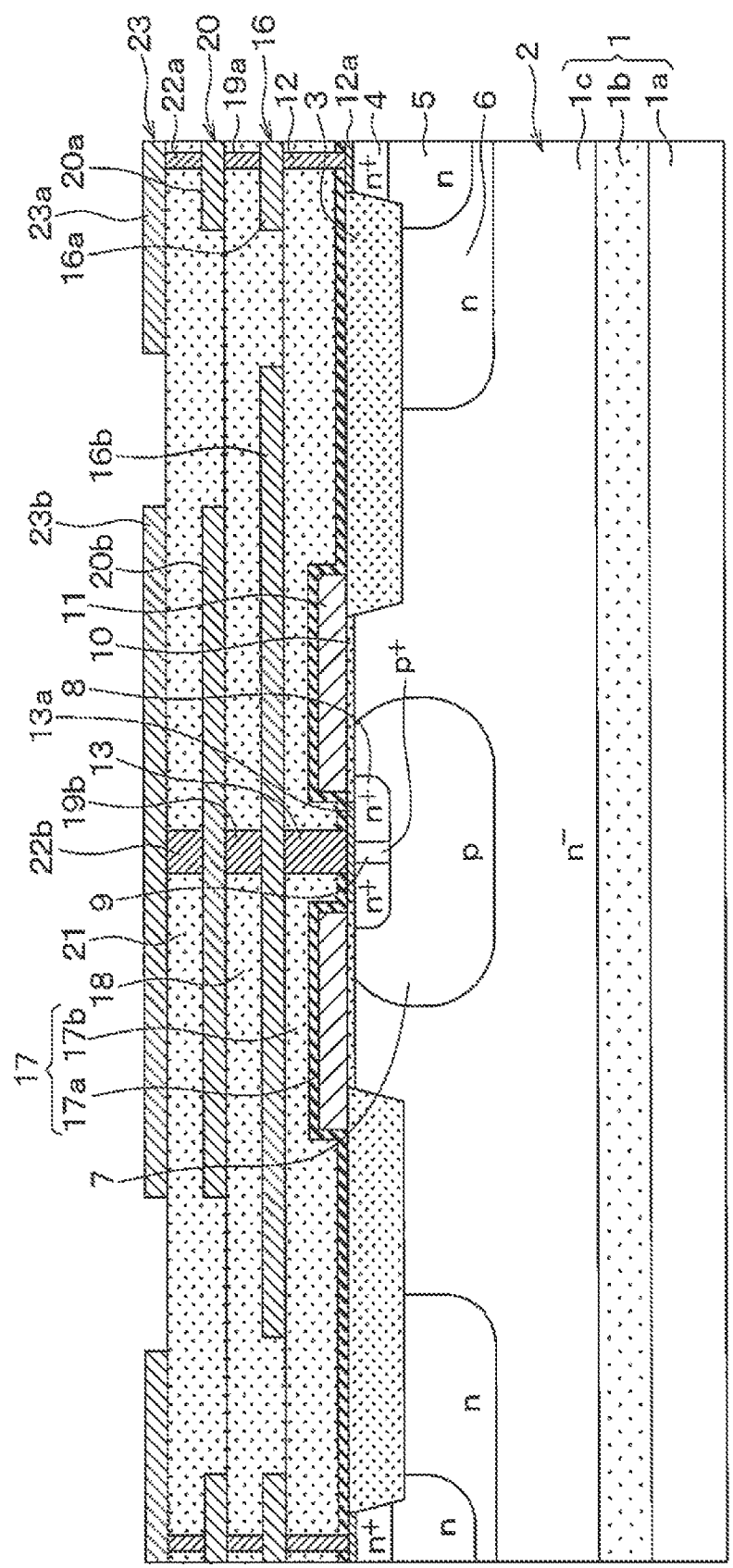
FIG. 8 is a diagram illustrating a cross-sectional view of a semiconductor device having a LDMOS according to another embodiment of the present disclosure.
Figure 9:
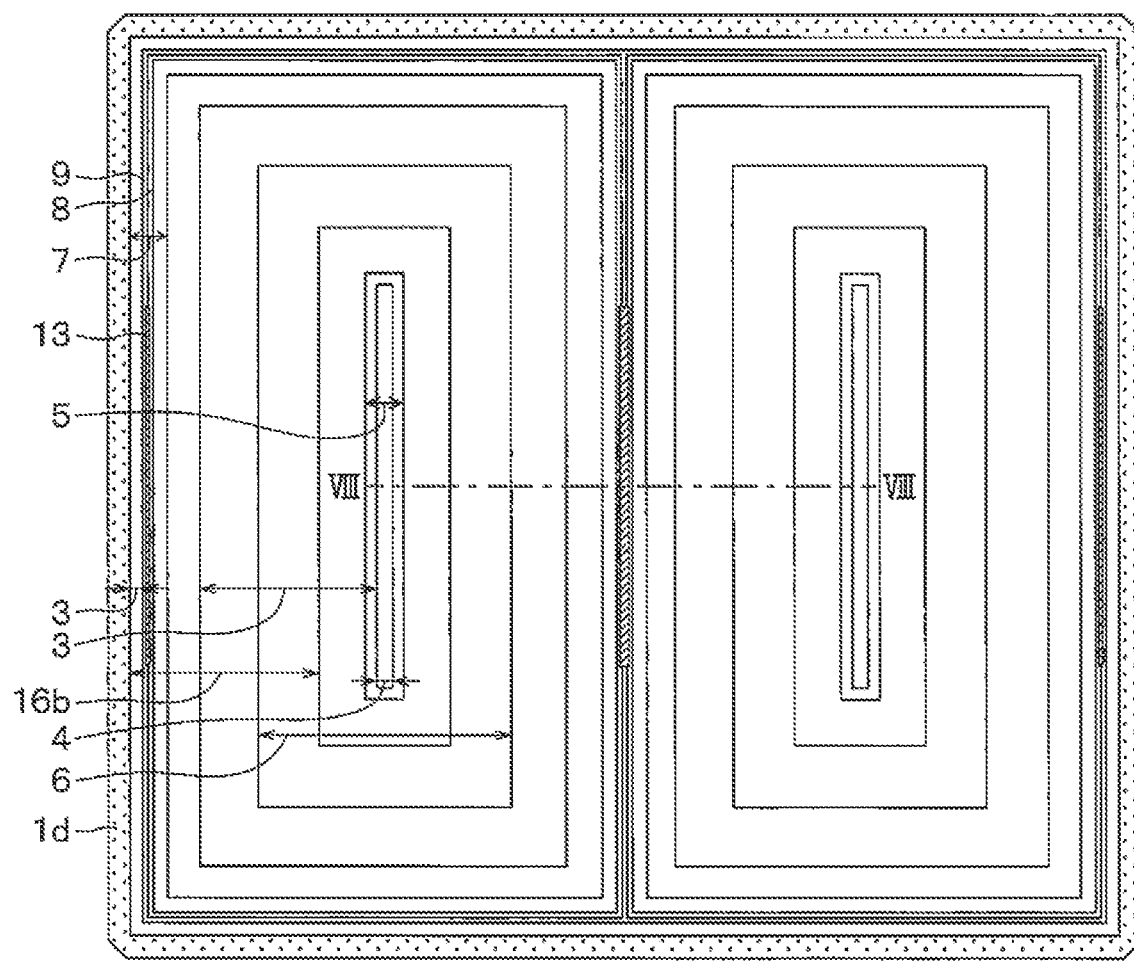
FIG. 9 is a diagram illustrating a top layout view of the LDMOS shown in FIG. 8.

For example, in each of the embodiments described above, only one cell of the LDMOS is arranged in the region surrounded by the trench separation structure 1d. Alternatively, multiple cells of the LDMOS may be arranged in the region surrounded by the trench separation structure 1d. In such a case, for example, respective parts constituting the LDMOS may be formed on both sides of the source electrode 13 and the p⁺ type contact layer 9 as the center, as shown in FIGS. 8 and 9. Further, it is not always necessary to have the buffer layer 5. The buffer layer 5 may be omitted.

As the layout of the LDMOS, the LDMOS having the rectangular shape has been exemplified. However, the layout of the LDMOS is not limited to the rectangular shape. For example, the layout may have a circular shape so that both the source and the drain have circular shapes. As another example, the LDMOS may have a layout in which the source side is the center of the cell and the drain side is formed so as to surround the periphery of the source. However, in order to increase the channel width, it is preferable to arrange the drain in the center of the cell.

In each of the embodiments described above, the case where the source wiring layer having a three-layer structure has been exemplified. However, the source wiring layer is not limited to the three-layer structure, and may be a single layer structure or a multi-layer structure other than three layers. In such cases, the source wiring layer in any layer may function as the SFP, and the source wiring layer functioning as the SFP may be appropriately selected according to the required breakdown voltage. Regardless of which source wiring layer is used to form the SFP, since the SFP is provided by using the source wiring layer formed above at least a part of the interlayer insulating film, that is, above the interlayer insulating film in the lowermost layer, the breakdown voltage can be improved.

Further, in each of the embodiments described above, the n-channel type LDMOS in which the n type is the first conductivity type and the p type is the second conductive type is exemplified. However, the present disclosure may be applied to a p-channel type LDMOS in which the conductivity type of each component is inverted.

What is claimed is:

1. A semiconductor device including a lateral transistor, comprising:
    a semiconductor substrate having a first conductivity type drift layer;
    a first conductivity type drain region disposed at a surface layer portion of the drift layer within the drift layer;
    a first conductivity type drain-drift layer disposed at the surface layer portion of the drift layer within the drift layer to surround the drain region, the drain-drift layer having an impurity concentration higher than that of the drift layer and lower than that of the drain region;
    a second conductivity type body layer disposed at the surface layer portion of the drift layer within the drift layer and at a position separate from the drain-drift layer, the body layer being configured to form a channel region;
    a first conductivity type source region disposed at a surface layer portion of the body layer within the body layer and terminated at a position inside from an end portion of the body layer;
    a separation insulating film disposed above the drain-drift layer and a part of the drift layer located between the body layer and the drain-drift layer;
    a gate insulating film disposed on a surface of the channel region of the body layer and connected to the separation insulating film, the channel region being provided in a part of the body layer between the source region and the drift layer;
    a gate electrode disposed on a surface of the gate insulating film and extending from a position above the gate insulating film to a position above the separation insulating film;
    an interlayer insulating film disposed above the gate electrode and the separation insulating film, and
    a drain electrode electrically connected to the drain region;
    a source electrode electrically connected to the source region and the body layer; and
    a source wiring layer disposed above at least a part of the interlayer insulating film and electrically connected to the source electrode, the source wiring layer extending toward the drain region to provide a source field plate, wherein
    a dimension of a part of the source field plate extending above the separation insulating film along a connection line connecting the source region and the drain region at a shortest distance is referred to as a length Lsfp,
    a dimension of the drain-drift layer along the connection line is referred to as a length Ldd,
    a dimension of the separation insulating film along the connection line is referred to as a width Wsti, and
    a proportion of a difference between the length Ldd and the length Lsfp with respect to the width Wsti is in a range of −10% or more and less than 0%, or greater than 0% and +20% or less.

2. The semiconductor device according to claim 1, wherein
    the interlayer insulating film and the source wiring layer are each one of layers in a multi-layer wiring structure including a plurality of interlayer insulating films and a plurality of source wiring layers, and
    the source field plate is provided by one of the plurality of source wiring layers in the multi-layer structure.

3. The semiconductor device according to claim 1, wherein
    a proportion of the length Ldd with respect to the width Wsti is equal to or less than 80%.

4. The semiconductor device according to claim 1, wherein
    the gate electrode is disposed to extend to the position above the separation insulating film, and a part of the gate electrode extending above the separation insulating film provides a gate field plate, and
    a dimension of the gate field plate along the connection line is referred to as a length Lgfp, and
    the length Lsfp is larger than the length Lgfp.

5. The semiconductor device according to claim 4, further comprising:
    a first conductivity type buffer layer disposed at the surface layer portion of the drift layer within the drift layer to surround the drift drain region, the buffer layer having an impurity concentration higher than that of the drift layer and lower than the drain region, wherein
    the drain-drift layer has an impurity concentration lower than that of the buffer layer, and is disposed to surround the buffer layer.

6. A semiconductor device including a lateral transistor, comprising:
    a semiconductor substrate having a first conductivity type drift layer;
    a first conductivity type drain region disposed at a surface layer portion of the drift layer within the drift layer;
    a first conductivity type drain-drift layer disposed at the surface layer portion of the drift layer within the drift layer to surround the drain region, the drain-drift layer having an impurity concentration higher than that of the drift layer and lower than that of the drain region;
    a second conductivity type body layer disposed at the surface layer portion of the drift layer within the drift layer and at a position separate from the drain-drift layer, the body layer being configured to form a channel region;
    a first conductivity type source region disposed at a surface layer portion of the body layer within the body layer and terminated at a position inside from an end portion of the body layer;
    a separation insulating film disposed above the drain-drift layer and a part of the drift layer located between the body layer and the drain-drift layer;
    a gate insulating film disposed on a surface of the channel region of the body layer and connected to the separation insulating film, the channel region being provided in a part of the body layer between the source region and the drift layer;
    a gate electrode disposed on a surface of the gate insulating film and extending from a position above the gate insulating film to a position above the separation insulating film;
    an interlayer insulating film disposed above the gate electrode and the separation insulating film, and
    a drain electrode electrically connected to the drain region;
    a source electrode electrically connected to the source region and the body layer; and
    a source wiring layer disposed above at least a part of the interlayer insulating film and electrically connected to the source electrode, the source wiring layer extending toward the drain region to provide a source field plate, wherein the interlayer insulating film and the source wiring layer are each one of layers in a multi-layer wiring structure including a plurality of interlayer insulating films and a plurality of source wiring layers, and the source field plate is provided by only a first one of the plurality of source wiring layers in the multi-layer structure, the first one being closest to the drift layer among the plurality of source wiring layers being three or more.

7. The semiconductor device according to claim 6, wherein
a dimension of a part of the source field plate above the separation insulating film along a connection line connecting between the source region and the drain region at a shortest distance is referred to as a length Lsfp,
a dimension of the drain-drift layer along the connection line is referred to as a length Ldd,
a dimension of the separation insulating film along the connection line is referred to as a width Wsti, and
a proportion of a difference between the length Ldd and the length Lsfp with respect to the width Wsti is in a range of −10% to +20%.

8. The semiconductor device according to claim 7, wherein
a proportion of the length Ldd with respect to the width Wsti is equal to or less than 80%.

9. The semiconductor device according to claim 6, wherein
the gate electrode is disposed to extend to the position above the separation insulating film, and a part of the gate electrode extending above the separation insulating film provides a gate field plate,
a dimension of a part of the source field plate above the separation insulating film along a connection line connecting between the source region and the drain region at a shortest distance is referred to as a length Lsfp,
a dimension of the gate field plate along the connection line is referred to as a length Lgfp, and
the length Lsfp is larger than the length Lgfp.

10. The semiconductor device according to claim 9, further comprising:
a first conductivity type buffer layer disposed at the surface layer portion of the drift layer within the drift layer to surround the drift drain region, the buffer layer having an impurity concentration higher than that of the drift layer and lower than the drain region, wherein
the drain-drift layer has an impurity concentration lower than that of the buffer layer, and is disposed to surround the buffer layer.

11. A semiconductor device including a lateral transistor, comprising:
a semiconductor substrate having a first conductivity type drift layer;
a first conductivity type drain region disposed at a surface layer portion of the drift layer within the drift layer;
a first conductivity type drain-drift layer disposed at the surface layer portion of the drift layer within the drift layer to surround the drain region, the drain-drift layer having an impurity concentration higher than that of the drift layer and lower than that of the drain region;
a second conductivity type body layer disposed at the surface layer portion of the drift layer within the drift layer and at a position separate from the drain-drift layer, the body layer being configured to form a channel region;

a first conductivity type source region disposed at a surface layer portion of the body layer within the body layer and terminated at a position inside from an end portion of the body layer;
a separation insulating film disposed above the drain-drift layer and a part of the drift layer located between the body layer and the drain-drift layer;
a gate insulating film disposed on a surface of the channel region of the body layer and connected to the separation insulating film, the channel region being provided in a part of the body layer between the source region and the drift layer;
a gate electrode disposed on a surface of the gate insulating film and extending from a position above the gate insulating film to a position above the separation insulating film;
an interlayer insulating film disposed above the gate electrode and the separation insulating film, and
a drain electrode electrically connected to the drain region;
a source electrode electrically connected to the source region and the body layer; and
a source wiring layer disposed above at least a part of the interlayer insulating film and electrically connected to the source electrode, the source wiring layer extending toward the drain region to provide a source field plate, wherein
the interlayer insulating film and the source wiring layer are each one of layers in a multi-layer wiring structure including a plurality of interlayer insulating films and a plurality of source wiring layers, and
the source field plate is provided by only one of the plurality of source wiring layers in the multi-layer structure, each of the source wiring layers being spaced apart from each other by plugs of the source electrode, the one being a third or higher one of the plurality of source wiring layers furthest from the drift layer among the plurality of source wiring layers being three or more.

12. The semiconductor device according to claim 11, wherein
a dimension of a part of the source field plate above the separation insulating film along a connection line connecting between the source region and the drain region at a shortest distance is referred to as a length Lsfp,
a dimension of the drain-drift layer along the connection line is referred to as a length Ldd,
a dimension of the separation insulating film along the connection line is referred to as a width Wsti, and
a proportion of a difference between the length Ldd and the length Lsfp with respect to the width Wsti is in a range of −10% to +20%.

13. The semiconductor device according to claim 12, wherein
a proportion of the length Ldd with respect to the width Wsti is equal to or less than 80%.

14. The semiconductor device according to claim 11, wherein
the gate electrode is disposed to extend to the position above the separation insulating film, and a part of the gate electrode extending above the separation insulating film provides a gate field plate,
a dimension of a part of the source field plate above the separation insulating film along a connection line connecting between the source region and the drain region at a shortest distance is referred to as a length Lsfp, a dimension of the gate field plate along the connection line is referred to as a length Lgfp, and the length Lsfp is larger than the length Lgfp.

15. The semiconductor device according to claim 14, further comprising:
- a first conductivity type buffer layer disposed at the surface layer portion of the drift layer within the drift layer to surround the drift drain region, the buffer layer having an impurity concentration higher than that of the drift layer and lower than the drain region, wherein
- the drain-drift layer has an impurity concentration lower than that of the buffer layer, and is disposed to surround the buffer layer.

* * * * *